United States Patent

Kendall

[15] 3,703,650

[45] Nov. 21, 1972

[54] INTEGRATED CIRCUIT WITH TEMPERATURE COMPENSATION FOR A FIELD EFFECT TRANSISTOR

[72] Inventor: Larry J. Kendall, Concord, Calif.

[73] Assignee: Signetics Corporation, Sunnyvale, Calif.

[22] Filed: Sept. 16, 1971

[21] Appl. No.: 181,090

[52] U.S. Cl.....................................307/310, 307/304

[51] Int. Cl...............................................H03k 23/08

[58] Field of Search..307/304, 279, 251, 221 C, 205, 307/308, 310, 378, 303

[56] References Cited

UNITED STATES PATENTS

| | | | |
|---|---|---|---|
| 3,414,739 | 12/1968 | Paidosh | 307/310 |
| 3,530,364 | 9/1970 | Nelson | 307/251 |
| 3,532,899 | 10/1970 | Huth | 307/304 |
| 3,560,768 | 2/1971 | Rimkus | 307/310 |
| 3,590,274 | 6/1971 | Marley | 307/310 |

*Primary Examiner*—Herman Karl Saalbach
*Assistant Examiner*—R. E. Hart
*Attorney*—Flehr, Hohbach, Test, Albritton & Herbert

[57] ABSTRACT

An integrated circuit with temperature compensation being provided for field effect transistors by a matched FET which provides an $I_{dss}$ which varies with temperature and which determines the drain current of the temperature compensated field effect transistors.

5 Claims, 4 Drawing Figures

INVENTOR
LARRY J. KENDALL
BY
Flehr, Hohbach, Test, Albritton & Herbert
ATTORNEYS INVENTOR
LARRY J. KENDALL
BY
Flehr, Hohbach, Test,
Albritton & Herbert
ATTORNEYS

INTEGRATED CIRCUIT WITH TEMPERATURE COMPENSATION FOR A FIELD EFFECT TRANSISTOR

BACKGROUND OF THE INVENTION

The present invention relates to an integrated circuit with temperature compensation being provided for field effect transistor pairs included in the circuit by a matching and integrated field effect transistor (FET).

Integrated FETs have suffered in the past by variations in output voltage with temperature change in the integrated circuit chip. In addition, they have not been operated at their optimum drain or biasing current.

OBJECTS AND SUMMARY OF THE INVENTION

It is, therefore, an object of this invention to provide a temperature compensation circuit for an integrated FET.

It is another object of the invention to provide a circuit as above which also provides optimum drain current for the FET.

In accordance with the above objects there is provided an integrated circuit with temperature compensation for a field effect transistor (FET) provided by a matching FET. First integrated FET means are provided. A second FET integrated with the same diffusions as the first FET means is provided whereby the second FET matches the first FET means. The second FET is located in the same area, relative to temperature variation of the integrated circuit, as the first FET means. The second FET has its gate and source shorted together to provide an $I_{dss}$ proportional to the temperature variation of the integrated circuit. Current means couple the second FET to the first FET means and provide a drain current for the first FET means proportional to the $I_{dss}$ of the second FET and a predetermined fraction of the $I_{dss}$ of the first FET means.

DETAILED DESCRIPTION OF THE PREFERRED EMBODIMENT

Figure 1:
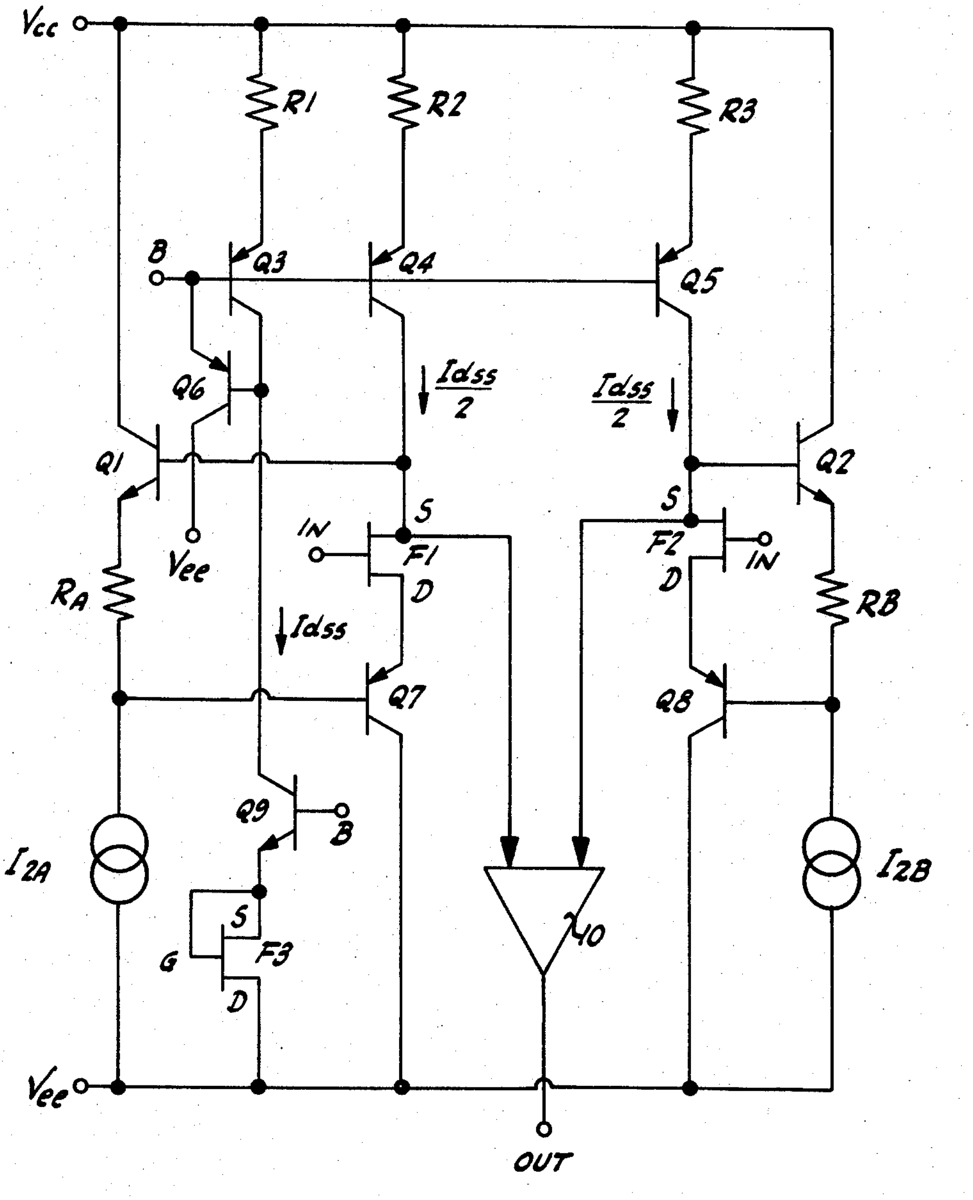
FIG. 1 shows a circuit embodying the present invention.

FIG. 1 illustrates an operational amplifier circuit which includes the junction type field effect transistors F1 and F2 having input terminals and forming a differential amplifier. Output terminals of F1 and F2 both couple into a normal amplifier 10 which then provides an output signal in response to the differential action of the input signals on the respective input terminals.

The drain to source voltage, $V_{ds}$, across both F1 and F2 is maintained substantially constant in the case of F1 by transistors Q1, Q7, $R_A$, and current source $I_{2A}$ and in the case of F2 by transistors Q2, Q8, $R_B$, and the current source $I_{2B}$. These current sources are matched and provide a voltage of, for example, 2 volts across the resistors $R_A$ and $R_B$ respectively which are tied between the emitter and base of Q1, Q7 and Q2, Q8. Thus, the field effect transistors F1 and F2 are in effect floated and they may freely vary with varying conditions on their input terminals without going into a breakdown condition.

In accordance with the invention F1 and F2 are provided with biasing drain current of one-half their short circuit current, $I_{dss}$, by a matching junction field effect transistor F3. Transistor F3 has its gate and source shorted together to provide a current $I_{dss}$, as indicated, through transistors Q9 and Q3. Transistor Q3 has coupled between its base and collector terminals a transistor Q6 which has its emitter coupled to the base of Q3 and the base coupled to the collector of Q3. The base of transistor Q3 is also coupled to matched integrated transistors Q4 and Q5. The emitters of transistors Q3, Q4 and Q5 are coupled to a common voltage $V_{cc}$ through identical integrated resistors R1, R2 and R3. Thus, the collector currents of transistors Q4 and Q5, because of the identical emitter resistors and transistor construction and the common base connection will be the same as the collector current of Q3 which is the $I_{dss}$ of F3.

As will be discussed in greater detail below, all of the field effect transistors F1, F2 and F3 are integrated with the same diffusions so that they are matched with respect to variation of drain current with temperature. However, transistor F3 is constructed so that its $I_{dss}$ is one half the $I_{dss}$ of F1 and F2. Thus, although identical currents are flowing in Q3, Q4 and Q5, the drain current of F1 and F2 relative to their $I_{dss}$ are one-half that of F3 relative to its $I_{dss}$. This provides for operation of F1 and F2 at optimum drain currents.

In operation, transistors Q1 and Q2 act as current sinks for the currents of $I_{2A}$ and $I_{2B}$. Similarly, transistors Q7 and Q8 act as current sinks for the drain currents from Q4 and Q5. The drain source voltages, $V_{ds}$, across both F1 and F2 are maintained constant since the base to emitter voltage of, for example in the case of F1, the transistors Q1 and Q7 cancel thus keeping $V_{ds}$ F1 constant over temperature changes. The same is true in the case of $v_{be}$'s of Q2 and Q8 canceling to maintain the $V_{ds}$ of F2 constant over temperature changes.

Since the drain currents of F1 and F2 are directly proportional to the $I_{dss}$ of F3 which varies by, for example, a temperature coefficient of $-0.7\%/°C$, a variation in temperature causes the $I_{dss}$ of F3 to vary in accordance with this coefficient which cancels out the effect of temperature on the match of F1 and F2 to provide in essence a zero coefficient of output voltage at the output terminal amplifier 10 with temperature change. This is because when the resistivity of the channels of F1 and F2 increase with temperature, the reduction of the respective drain currents by the coefficient $-0.7\%/°C$ causes the effective channel height of the FETs to remain approximately constant with temperature. Without this temperature compensation the effective channel height would have to be increased to accept a constant current.

Figure 2:
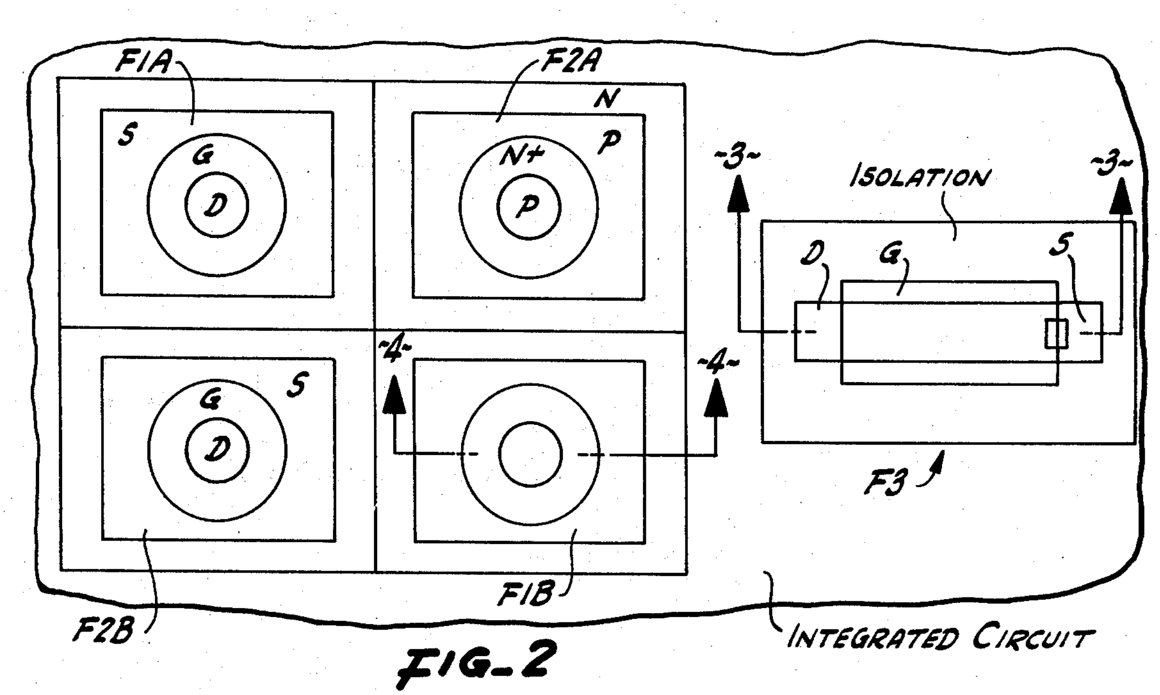
FIG. 2 is a plan view of a portion of the circuit of FIG. 1 shown in an integrated format.
Figure 4:
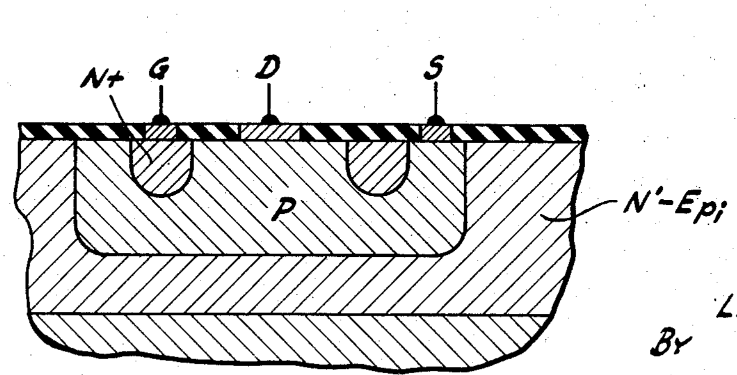
FIG. 4 is an enlarged cross-section view of an FET taken along the line 4—4 of FIG. 2.

The circuit of FIG. 1 is integrated on a single circuit chip and a portion of this integration is illustrated in FIG. 2. Specifically, FIG. 2 shows the transistors F1A and F1B and a second transistor pair F2A and F2B to provide for better temperature characteristics. The transistors are manufactured in two diffusions as shown in FIG. 4 the first being a P type diffusion in the N epitaxial layer and a second annular diffusion of N+ material which forms the circuit of the gate region. The drain is in the central area of the annulus and the source is the outer rectangular region.

Figure 3:
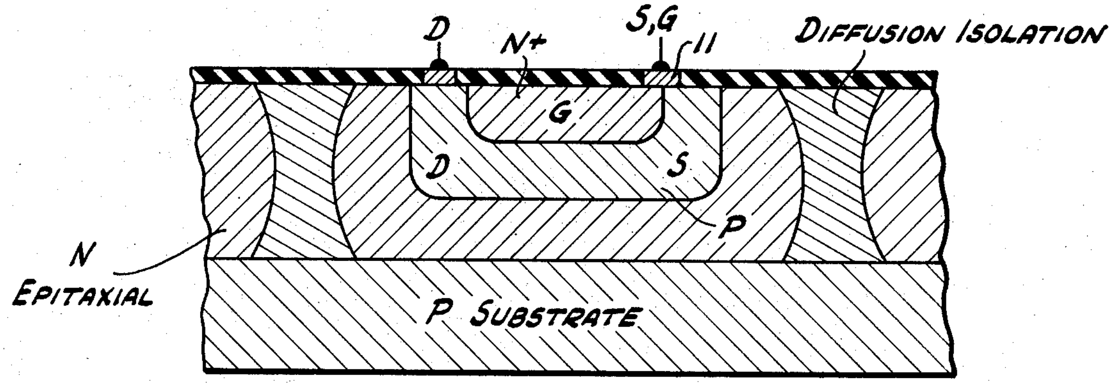
FIG. 3 is an enlarged cross-sectional view of an FET taken along the line 3—3 of FIG. 2.

Transistor F3 of a rectangular configuration as best shown in FIG. 3 is constructed by a first P type diffusion into an N epitaxial layer to form source and drain regions. Thereafter an N+ gate region is diffused in the P type region to form a gate region. The top gate is connected to the back gate by the overlapping of the gate diffusion with the epitaxial layer as best shown in FIG. 2. In addition, the gate and source are shorted or tied together by an evaporated layer of conductive material 11.

FET F3 is diffused at the same time as F1 and F2 to provide the desired matching characteristics. These transistors are also located in the same area of the integrated circuit relative to temperature variation. In other words, F1, F2 and F3 are located around an isothermal line of the integrated circuit.

Thus, the present invention provides an integrated circuit with temperature compensation being provided for the field effect transistors included in the circuit by a matching and integrated field effect transistor. Optimum drain current is also provided.

I claim:

1. An integrated circuit with temperature compensation for a field effect transistor (FET) provided by a matching FET said circuit comprising: first integrated FET means which includes two field effect transistors; a second FET integrated with the same diffusions as said first FET means whereby said second FET matches said first FET means, said second FET being located in the same area, relative to temperature variation of said integrated circuit, as said first FET means, said second FET having its gate and source shorted together to provide an $I_{dss}$ proportional to the temperature variation of the integrated circuit in said area; and current means coupling said second FET to said first FET means and providing a drain current for said first FET means proportional to said $I_{dss}$ of said second FET and a predetermined fraction of the $I_{dss}$ of the first FET means, said current means providing equal drain currents for said two field effect transistors of said first FET means.

2. An integrated circuit as in claim 1 where said current means supplies a drain current of $I_{dss}/2$ to each of the field effect transistors of said first FET means which is equal to the $I_{dss}$ of said second FET.

3. An integrated circuit as in claim 2 where said current means includes three integrated transistors having their bases tied together, their emitters being respectively coupled to a common voltage supply through three series connected resistors of equal value and their collectors being coupled to said second FET and said two field effect transistors respectively.

4. An integrated circuit as in claim 2 where said two field effect transistors form a differential amplifier.

5. An integrated circuit as in claim 1 where said second FET has an $I_{dss}$ equal to one-half the $I_{dss}$ of said first FET means.

* * * * *